Dec. 14, 1965 SHOICHIRO HOSHINO ET AL 3,223,838

METHOD FOR THE PREPARATION OF RELIEF IMAGES BY THE USE OF A HEAT-SENSITIVE SHEET

Filed Oct. 9, 1963

United States Patent Office 3,223,838

Patented Dec. 14, 1965

3,223,838

METHOD FOR THE PREPARATION OF RELIEF IMAGES BY THE USE OF A HEAT-SENSITIVE SHEET

Shoichiro Hoshino, Suginami-ku, and Akira Kato, Hachi-oji, both of Tokyo, Japan, assignors to Konishiroku Photo Industry Co., Ltd., Tokyo, Japan, a corporation of Japan Filed Oct. 9, 1963, Ser. No. 314,907

Claims priority, application Japan, Oct. 16, 1962, 37/46,125; Feb. 7, 1963, 38/6,414

6 Claims. (Cl. 250—65)

Figure 1:
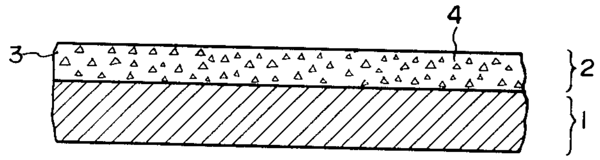

This invention relates to a method for preparing relief images, and more particularly, to such a method using a heat-sensitive composition comprising the dispersed mixture of a heat-fusible material in a high polymeric material.

A relief image has many applications, such as letterpress printing, deep-etch plate printing and intaglio printing in the graphic arts and the prepartions of print circuit diagrams and name plates, and various methods to prepare such relief image have been proposed.

There are many known chemical methods for the preparation of a relief image, including those wherein a light-sensitive liquid composition comprising polyvinyl alcohol-bichromate, egg albumen-bichromate, polyvinyl cinnamate known as a light-sensitive polymer or the like is coated on a support, superposed with an original, exposed to ultraviolet radiation and then treated with a suitable liquid developer to prepare a relief image. Another known method is that wherein a light-sensitive gelatino-silver halide emulsion after being superposed with an original and exposed light is hardened by tanning development to prepare a relief image. There are also many well known mechanical methods including a primitime method using simply hands and a method using an electro-photoengraving machine known as Klischograph or Autograver. Among these conventional methods, the chemical methods have to be carried out in a dark room because of the necessity for handling of light-sensitive materials and further the operations involved therein generally are very troublesome. On the other hand, the physical or mechanical methods have serious disadvantages, e.g. inferior fidelity of the relief image thus obtained, and the great cost of the required apparatus.

The present invention entirely differs from the conventional methods in that it makes use of the action of infrared radiation and is carried out by comparatively simple procedures even in a bright room.

It is an object of this invention to provide new methods for producing relief images. More specific objects are to provide such methods for producing intermediate masters suitable for use in diazo type copying, and intaglio images suitable for use in gravure printing and for producing printing reliefs suitable for use as letterpress printing plates. Another specific object is to provide a new method for producing decorative relief images. Yet another object is to provide simple processes for producing such reliefs. A further object is to provide such methods which utilize economical materials in convenient process steps. Other objects, features, capabilities and advantages which are comprehended by the invention will be apparent from the description and claims which follow:

In accordance with a method embodying the present invention, a heat-sensitive sheet which comprises a support and, coated thereon, a heat-sensitive layer comprising the dispersed mixture of a heat-fusible material, with or without a dyestuff compound and/or a pigment, in a high polymeric material as binder, is superposed with an original to form a composite and then the composite is subjected to infrared radiation until thermal change occurs in those areas of the heat-sensitive layer corresponding to the heat-absorbing parts on the original. After such thermal change occurs, the sheet is treated on its heat-sensitive surface with a solvent to produce a relief image.

Figure 2:
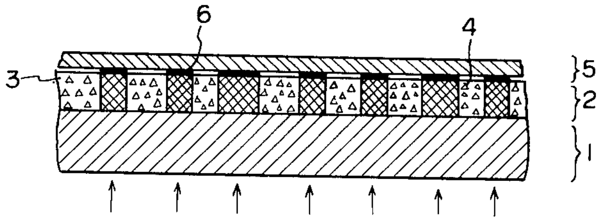
Figure 3:
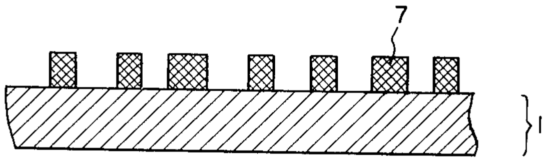
Figure 4:
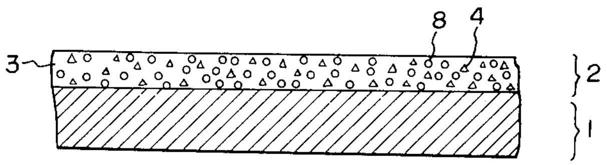
Figure 5:
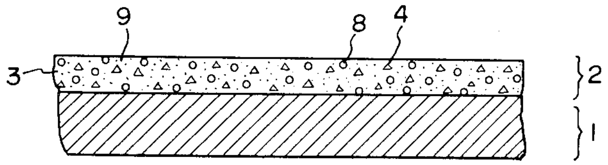
Figure 6:
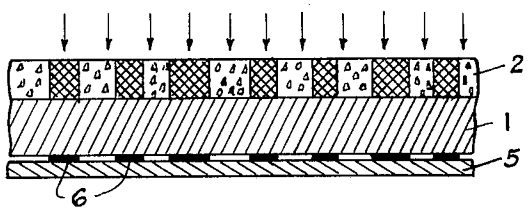

In the accompanying drawing, FIGURE 1 is an enlarged sectional view of a heat-sensitive sheet as used in the present invention. FIGURE 2 is an enlarged sectional view of the composite formed of the heat-sensitive sheet and an original superposed thereon as subjected to the infrared radiation. FIGURE 3 is a sectional view of the resulting relief image. FIGURES 4 and 5 are enlarged sectional views of different examples of a heat-sensitive sheet as used in the present invention. FIGURE 6 is a view similar to that of FIGURE 2, but showing a different arrangement of the original and heat-sensitive sheet for exposure to infrared radiation.

The principle involved in the preparation of a relief image in accordance with the present invention will be hereafter explained with reference to the attached drawing. In FIGURE 1, a support 1 (e.g., a translucent paper) is coated wth a heat-sensitive layer 2 comprising a heat-fusible material 4 (the sign $\Delta$ in the figure) dispersed in a high polymeric compound 3 as a binder. As shown in FIGURE 2, this heat-sensitive sheet is brought into face-to-face contact with an original 5 and subjected to infrared radiation from the support side of the heat-sensitive sheet. Since each heat-absorbing part 6 (an image area) of the original 5 absorbs heat and thus is raised to a high temperature, the heat-fusible material in the heat-sensitive layer fuses uniformly with the high polymer compound to form a fused mixture (represented by the meshes in the figure) in each part of the layer 2 corresponding to the part 6. Then, the original and the heat-sensitive sheet are separated and the surface of the heat-sensitive sheet is rubbed with cotton, sponge or the like impregnated with a solvent for the high polymeric compound but not for the heat-fusible material. Thus, each non-heat-absorbing part (corresponding to a non-image area of the original) of the heat-sensitive layer 2 is removed because the high polymer compound therein is dissolved into the solvent, while each part which absorbs heat (corresponding to an image area of the original) is retained as a relief 7 on the support as shown in FIGURE 3, because the heat-fusible material therein, which is insoluble in the solvent, is fused uniformly with the high polymeric compound, and therefore is difficult to dissolve into the solvent. Thus, a relief image invention is obtained. By selection of a suitable support, the relief image obtained according to the present invention is conveniently used as an offset master, a printing circuit matrix and the like. As shown in FIGURE 4, the heat-sensitive sheet may comprise, in addition to the heat-fusible material, a finely powdered pigment 8 (the sign O in the figure) dispersed in the heat-sensitive layer so as to have various uses as an intermediate master and the like. Moreover, as shown in FIGURE 5, the heat-sensitive sheet may comprise, in addition to the heat-fusible material, a finely powdered dyestuff compound 9 (the sign · in the figure) dispersed in the heat-sensitive layer so as to be unable for a spirit printing master.

A heat-sensitive sheet as used in accordance with the present invention is prepared generally in the following way: A solution of a high polymeric compound (binder component) in a suitable solvent is mixed with a heat-fusible material in combination with or without a finely powdered pigment and/or a finely powdered dyestuff compound, with the heat-fusible material and the pigment or dyestuff being insoluble in the solvent. Then, the total mixture is uniformly milled in a ball mill to give a dispersion, which in turn is coated on a suitable support and then dried to form the desired heat-sensitive sheet. Therefore, various combinations of the ingredients (i.e a high polymeric compound, a heat-fusible material and a pigment or dyestuff compound) are possible depending on the type of a solvent used in the preparation of the heat-sensitive sheet. For example, when a solvent such as ligroin is used, a high polymeric compound such as a conventional thermoplastic material easily soluble in said solvent and a heat-fusible material insoluble in said solvent, such as anhydrous phthalic acid, are used. On the other hand, if water is used as the solvent, a high polymeric compound such as carboxymethylcellulose is used in combination with a heat-fusible material insoluble in water, such as a paraffin emulsion.

Suitable for use as the binder component is a film-forming thermoplastic polymeric material. Almost all of the conventionally known heat-softening polymeric materials can be used for the purposes of the present invention, provided that the selected material does not significantly soften at a temperature as high as the fusing temperature of the fusible material.

Typically suitable polymeric materials include naturally occurring high polymeric materials, such as gelatine and gum arabic; cellulose derivatives, e.g. acetyl cellulose, carboxymethyl cellulose, ethyl cellulose; polyvinyl alcohol, polyvinyl chloride, polystyrene, polyvinyl acetate, polyvinyl butyral, polyvinyl carbazole, polyketones, styrene-butadiene copolymers, and synthetic and cyclized rubbers.

The fusible material should be one having a melting point between 50° and 150° C. and which, at such high temperature, becomes compatible with the binder component. There are known a variety of organic compounds which are suitable for the above-mentioned purpose, and typically they include hydrocarbons, e.g. paraffin hydrosol (that is a wax emulsion), diphenyl (M.P. 70° C.), naphthalene (M.P. 80° C.), etc.; organic acids, e.g. maleic anhydride (M.P. 53° C.), stearic acid (M.P. 69° C.), succinic anhydride (M.P. 120° C.), benzoic acid (M.P. 122° C.), phthalic anhydride (M.P. 130° C.), adipic acid (M.P. 153° C.), cinnamic acid (M.P. 133° C.), etc.; acid amides, e.g. acetanilide (M.P. 114° C.), benzamide (M.P. 128° C.), urea (M.P. 133° C.), etc. Other suitable compounds may include, for example, diphenyl guanidine, p-toluene-sulfonamide, acetyl-salicylic acid and so on. They can be used singly or in combination. However, it is to be understood that the above-enumerated compounds are informative only and the present invention is not limited thereto.

Pigments which are usable as an additional component if desired herein are required to have a high covering power and to be incapable of absorbing infrared radiation. As long as the above-mentioned requirements are satisfied, any colored pigments can be used. Typical of such pigments are titanium dioxide, silicon dioxide, zinc oxide, zinc sulfide, white lead (basic lead carbonate), cadmium sulfide, chrome yellow, red iron oxide, barium sulfate, barium carbonate, calcium sulfate, etc. They are very convenient because of their being insoluble in any solvent that may be used.

A large number of dyestuff compounds also are suitable as an additional component of the present invention. Almost all of the commercially available dyestuffs are particularly preferred because they have adequate particle size required for the purpose of the present invention. Typical dyestuffs which can be used in the present invention are Oracet Violet 2R (C.I. 61100), Oracet Sapphire Blue G (C.I. 64500), Orasol Navy Blue RB (C.I. Solvent Blue I), Orasol Black BR (C.I. Solvent Black 9), Kiton Green V (C.I. 44025), Orasol Fast Black G (C.I. Solvent Black 18), Iosol Black (C.I. Solvent Black 13), Sudan Deep Black BB (C.I. Solvent Black 9), Oracet Turquoise Blue G (C.I. Solvent Blue 17), Zapon Fast Black, Oracet Blue BLW, and so on. They can be used singly or in combination.

The solvent to be used for the solution of the binder should be a non-solvent for the other components used. Such solvent is selected depending on the types of the essential and other optional components as well as the binder used. Typical solvents sometimes preferred are hydrocarbons and halogenated hydrocarbons, including benzene, xylene, toluene, ligroin, trichloroethylene, carbon tetrachloride, n-hexane, methylene chloride, ethyl acetate, mineral spirits, etc.

The above-specified components for a heat-sensitive sheet of the invention should preferably be used in the following proportions:

| | Parts by weight |
|---|---|
| Fusible organic material | 15–30 |
| Thermoplastic polymeric material | 1.5–9 |
| Solvent | 100 |

The relative proportion between the solvent and the solids may be critical depending on the type of coating method used. For any ordinary coating method, however, the above-indicated range is appropriate.

If a colored relief image is desired, a pigment or pigments and/or a dyestufi or dyestuffs are used in addition to the above-indicated formulation. When a pigment is used, 10% to 60% of the fusible organic material can be saved by addition of an equal amount of the pigment. If a dyestuff compound is used, it should be added in the proportion of 0.15–15 parts by weight to the formulation.

Suitable materials for the support include transparent or translucent papers, and films of, for example, cellulose esters, such as, cellulose triacetate; polyesters obtained by polycondensation of phthalic, isophthalic or terephthalic acid with a dihydric alcohol, such as polythylene terephthalate, poly [cyclohexane-1,4-dimethylol] terephthalate; and polycarbonates including those obtained by the polycondensation of bis-phenol A with carbonic acid. Sometimes, offset master papers, metal-lined plastic plates, glass plates and metal plates are usable. To such support, the above-mentioned liquid dispersion (in which a heat-fusible material together with or without a finely powdered dyestuff compound and/or a finely powdered inorganic pigment are dispersed with a solution of a polymeric compound in a solvent) is applied in the manner conventionally known per se, as by coating or pouring. A suitable thickness of the heat-sensitive layer coated is 3–12 microns expressed as dry thickness.

In carrying out application of infrared radiation to the heat-sensitive material of this invention, it is convenient to use a quartz infrared lamp as a heat source. The radiation period should preferably be as short as possible in order to have effective utilization of heat absorbed by the image area of the original, while avoiding heat loss due to transport to the non-image area, and this is accomplished by employing a heat source having a high output. In general, appropriate infrared radiation can be effected at the rate of 3–10 cm./sec. by using a quartz infrared lamp of 30–100 watts/cm. output. A Thermofax copying machine (manufactured by Minnesota Mining & Mfg. Co., U.S.A.) may be conveniently used for this purpose.

The following examples describe certain ways in which the principle of the invention has been applied, but are not to be construed as limiting its scope.

*Example 1*

Ethocel (the trade name of ethyl cellulose resin manufactured and sold by Dow Chemical Co., U.S.A.) which is a high polymeric compound is used to prepare a 2% toluene solution containing said compound. 1000 ml. of this solution is added with 200 g. of red iron oxide ($Fe_2O_3$) and then, the resulting mixture is thoroughly milled in a ball mill to form a dispersion. Separately, 500 ml. of the Ethocel solution is added to 120 g. of phthalic anhydride and then milled in a ball mill in the same manner as above to give a dispersion. The two dispersions thus prepared are combined and dispersed further completely. The resulting liquid dispersion is coated to a 5-micron thickness on a tracing sheet as a support to prepare a heat-sensitive sheet. The heat-sensitive sheet is placed in face-to-face relation to the image or message-bearing surface of an original, and then infrared radiation is effected from the support side of the heat-sensitive sheet by means of a Thermofax copying machine (the trade name of the Minnesota Mining & Mfg. Co., U.S.A.). As a result of the infrared radiation, each part of the heat-sensitive layer corresponding to an image area of the original becomes insoluble in a solvent. Therefore, if the heat-sensitive surface is lightly rubbed with a printing pad impregnated with carbon tetrachloride so as to effect development of the desired image, each part of the heat-sensitive layer corresponding to a non-image area of the original is removed thereby providing a relief image. The relief image can be used as an intermediate master for a diazo copying process to produce a great number of additional copies. The relief image obtained by the above method is very excellent as an intermediate master, because of its good light absorption and further because an image of the original may be brought into direct contact with the light-sensitive surface of a diazo paper. By reason of the foregoing, a diazo copy showing both good clearness and high resolving power in comparsion with those obtained by the conventional diffusion transfer reversal process is obtainable. Moreover, the relief image obtained according to the present invention may be erased by treating it with a solvent of higher dissolving power, so that it is readily possible to make correction as by wiping away an unnecessary part of the relief image. For example, methylene chloride-impregnated cotton is used to rub off an unnecessary part of the relief image.

*Example 2*

Six grams of Saran F 220 (the trade name of vinylidene chloride-acrylonitrile copolymeric resin manufactured by Dow Chemical Co., U.S.A.) which is a high polymeric compound, together with 20 g. of phthalic anhydride, 30 g. of zinc oxide, 1.5 g. of Orasol Navy Blue RB and 200 ml. of benzene are thoroughly milled in a ball mill to give a dispersion. The resulting dispersion is coated on a tracing paper to prepare a heat-sensitive sheet. Then, the following steps of the process are carried out in the same manner as in Example 1, so that a relief image useful as an intermediate master may be prepared. In this case, development is carried out by use of n-hexane, and if correction is necessary, acetone is used to remove any unnecessary part from the relief image.

*Example 3*

Ten grams of Vinoflex 452 (the trade name of polyvinyl chloride resin manufactured by Badische Aniline- u. Soda-Fabrik A.G., Germany) which is a high polymeric compound, is dissolved into 400 ml. of benzene, and the resulting solution is added to 40 g. of acetanilide, 10 g. of Santocel C (the trademark of finely powdered silica manufactured by Monsato Chemical Co., U.S.A.) and 4 g. of Oraset Turquoise Blue G, and then thoroughly milled in a ball mill to give a dispersion. The liquid dispersion thus prepared is coated to a 7-micron thickness on a spirit master paper to prepare a heat-sensitive sheet for spirit master. The heat-sensitive surface of this sheet is brought into contact with the image-bearing surface of a typewritten original on a translucent paper, and infrared radiation is carried out in the same manner as in Example 1. By lightly rubbing the heat-sensitive surface with a benzene-impregnated pad after the infrared radiation, the parts of the heat-sensitive layer corresponding to the non-image areas of the original are removed to provide a relief image suitable for spirit printing. The relief image is mounted on the drum of a spirit printing machine of a commercially available type, the mixture of one part of acetone with two parts of alcohol being used as a printing liquid, so that about forty prints having clearly readable images on writing papers of B4 size (257 mm. x 364 mm.) may be obtained. In this case, any unnecessary part may be easily removed from the relief image with acetone.

*Example 4*

Three grams of Pliolite NR (the trade name of cyclized rubber manufactured by Goodyear Tire & Rubber Co., U.S.A.) which is a high polymeric compound, 10 g. of diphenylguanidine and 15 g. of titanium oxide are thoroughly milled together with 150 ml. of ligroin in a ball mill. 0.6 g. of Oraset Violet is added and additional milling is effected. The resulting liquid dispersion is coated to a 3-micron thickness on a cellulose triacetate film base which has been saponified to make its surface hydrophilic. As shown on FIGURE 6, the support side 1 of the heat-sensitive sheet thus obtained is brought into contact with the written surface of an original 5, subjected to infrared radiation from the side of the sensitive layer surface 2 and then developed with ligroin. The relief image thus obtained per se may be used as an offset master because its image area is oleophilic while the non-image area is hydrophilic. An unnecessary part of the relief image may be removed with acetone.

*Example 5*

Ten grams of the chlorinated rubber used in Example 4 is dissolved into 200 ml. of xylene. Separately, 50 g. of adipic acid is thoroughly dispersed with 100 ml. of xylene in a ball mill. The former solution is added into the latter and the resulting mixture is thoroughly mixed again to provide a dispersion. The dispersion is coated to an 8-micron thickness on a plastic covered with a copper foil to prepare a heat-sensitive plate useful as a printed circuit base. This plate is brought into contact, at its heat-sensitive surface, with a tracing paper on which a printed circuit diagram is drawn, subjected to infrared radiation and then developed with ligroin to give a relief image. This relief image per se, which is made of rubber having high chemical resistance, may be etched with a ferric chloride solution of 40° Baumé degree, so that the copper foil in the non-image area dissolves away to provide a minute clear printed circuit matrix. The relief image may be easily modified or removed with dioxane.

What we claim is:

1. A method for the preparation of a relief image; which comprises superposing an image-bearing original and a heat-sensitive sheet having a support and a layer thereon comprised of a heterogeneously dispersed mixture of a heat-fusible material having a melting point of from 50° to 150° C. in a polymeric compound as a binder, exposing the superposed original and heat-sensitive sheet to infrared radiation until said heat-fusible material fuses homogeneously with said polymeric compound in those parts of said layer corresponding to image areas of said original, and thereafter treating said layer of said sheet with a solvent in which said polymeric compound is soluble and said heat-fusible material is substantially insoluble so as to remove said layer from said support with the exception of said parts of the layer in which the heat-fusible material is fused homogeneously with the polymeric compound whereby said parts of the layer remaining on the support define a relief image of the image on said original.

2. The method as in claim 1; wherein said original and said sheet are superposed with said image of the original and said layer of the sheet in face-to-face relation, so that said image defined by said parts remaining on the support is a mirror image of the image borne by said original.

3. The method as in claim 1; wherein said original and said sheet are superposed with the image-side of the original and said layer of the sheet facing in the same direction so as to yield a true relief image of said image by the original.

4. The method as in claim 1; wherein said dispersed mixture further contains a finely divided coloring agent which is insoluble in said solvent.

5. The method as in claim 4; wherein said coloring agent is a dyestuff compound.

6. The method as in claim 4; wherein said coloring agent is an inorganic pigment.

References Cited by the Examiner

UNITED STATES PATENTS

| | | | |
|---|---|---|---|
| 2,875,051 | 2/1959 | De Maria. | |
| 2,893,868 | 7/1959 | Barney | 101—401.1 X |
| 2,939,009 | 5/1960 | Tien | 250—65 |
| 2,999,035 | 9/1961 | Sahler | 250—65 |

RALPH G. NILSON, *Primary Examiner.*

WILLIAM F. LINDQUIST, *Assistant Examiner.*